(12) United States Patent
Schmidt et al.

(10) Patent No.: US 10,211,180 B2
(45) Date of Patent: Feb. 19, 2019

(54) METHOD FOR PRODUCING A BONDABLE COATING ON A CARRIER STRIP

(71) Applicant: Heraeus Deutschland GmbH & Co. KG, Hanau (DE)

(72) Inventors: Joachim-Franz Schmidt, Linsengericht (DE); Marcel Neubauer, Hanau (DE)

(73) Assignee: Heraeus Deutschland GmbH & Co., KG, Hanau (DE)

( * ) Notice: Subject to any disclaimer, the term of this patent is extended or adjusted under 35 U.S.C. 154(b) by 0 days.

(21) Appl. No.: 15/118,171

(22) PCT Filed: Feb. 12, 2015

(86) PCT No.: PCT/EP2015/053006
§ 371 (c)(1),
(2) Date: Aug. 11, 2016

(87) PCT Pub. No.: WO2015/121367
PCT Pub. Date: Aug. 20, 2015

(65) Prior Publication Data
US 2017/0170139 A1  Jun. 15, 2017

(30) Foreign Application Priority Data
Feb. 14, 2014  (DE) .......... 10 2014 101 882

(51) Int. Cl.
*B23K 20/00* (2006.01)
*H01L 23/00* (2006.01)
(Continued)

(52) U.S. Cl.
CPC .............. *H01L 24/78* (2013.01); *B23K 20/02* (2013.01); *B23K 20/24* (2013.01); *B32B 15/017* (2013.01);
(Continued)

(58) Field of Classification Search
CPC ....... B23K 20/02; B23K 20/023; B23K 20/24
See application file for complete search history.

(56) References Cited

U.S. PATENT DOCUMENTS 4,339,644 A    7/1982  Aldinger et al.
4,749,548 A *  6/1988  Akutsu .................... C22C 9/00
                                                    257/E23.053
(Continued)

FOREIGN PATENT DOCUMENTS

DE    2940772 A1    4/1981
DE    3343250 A1    6/1985
(Continued)

OTHER PUBLICATIONS

Machine Translation of DE 4229270 (translated Sep. 29, 2017). (Year: 1994).*
(Continued)

*Primary Examiner* — Erin B Saad
(74) *Attorney, Agent, or Firm* — Panitch Schwarze Belisario & Nadel LLP

(57) ABSTRACT

A method for producing a bondable coating on a metallic carrier strip made of a brass alloy with at least 15 wt. % zinc or an excretion-hardening copper-based alloy containing at least 0.03 wt. % titanium, chromium, zirconium and/or cobalt is provided. According to the method, in a single working step, a bondable metallic functional layer made of aluminum or an aluminum-based alloy and a metallic intermediate layer are placed onto the metallic carrier strip and bonded thereto using a roll cladding method. The intermediate layer is arranged fully between the functional layer and the metallic carrier strip, so that no contact between the functional layer and the metallic carrier strip is created. A coated carrier strip produced using such a method. The intermediate layer is arranged and affixed on the carrier strip (Continued)

and the functional layer is arranged and affixed on the intermediate layer.

13 Claims, 3 Drawing Sheets

(51) Int. Cl.
| | |
|---|---|
| H01L 23/495 | (2006.01) |
| H01L 21/48 | (2006.01) |
| B23K 20/02 | (2006.01) |
| B23K 20/24 | (2006.01) |
| B32B 15/01 | (2006.01) |
| B32B 15/04 | (2006.01) |
| B32B 15/20 | (2006.01) |
| C22C 9/04 | (2006.01) |
| C22C 21/02 | (2006.01) |

(52) U.S. Cl.
CPC ............ *B32B 15/043* (2013.01); *B32B 15/20* (2013.01); *C22C 9/04* (2013.01); *C22C 21/02* (2013.01); *H01L 21/4842* (2013.01); *H01L 23/49579* (2013.01); *H01L 23/49582* (2013.01); *B32B 2457/00* (2013.01); *H01L 24/45* (2013.01); *H01L 24/48* (2013.01); *H01L 2224/45124* (2013.01); *H01L 2224/4847* (2013.01); *H01L 2224/7898* (2013.01); *H01L 2224/85424* (2013.01); *H01L 2924/00014* (2013.01)

(56) References Cited

U.S. PATENT DOCUMENTS

| | | | |
|---|---|---|---|
| 5,476,725 A * | 12/1995 | Papich | ................. B22D 11/008 148/523 |
| 2012/0040120 A1* | 2/2012 | Schwalm | ............ C08F 290/067 428/36.9 |

FOREIGN PATENT DOCUMENTS

| | | | | |
|---|---|---|---|---|
| DE | 3631119 | A1 | | 4/1987 |
| DE | 4229270 | A1 | | 3/1994 |
| DE | 102008025664 | A1 | | 12/2008 |
| DE | 102008018204 | A1 | | 8/2009 |
| EP | 0027520 | A1 | | 4/1981 |
| GB | 1139102 | A | * | 1/1969 ............. B23K 20/22 |

OTHER PUBLICATIONS

DE334250 computer english translation (Year: 1985).*
Int'l Search Report dated May 6, 2015 in Int'l Application No. PCT/EP2015/053006.
Int'l Preliminary Report on Patentability and Written Opinion dated Aug. 16, 2016 in Int'l Application No. PCT/EP2015/053006.

* cited by examiner

METHOD FOR PRODUCING A BONDABLE COATING ON A CARRIER STRIP

CROSS-REFERENCE TO RELATED APPLICATIONS

This application is a Section 371 of International Application No. PCT/EP2015/053006, filed Feb. 12, 2015, which was published in the German language on Aug. 20, 2015, under International Publication No. WO 2015/121367 A1 and the disclosure of which is incorporated herein by reference.

BACKGROUND OF THE PRESENT INVENTION

The present invention relates to a method for producing a bondable coating on a carrier strip and to a carrier strip coated with such a method.

In power electronics, copper-based strips are used for the electronic connection of power components with bond wires. It is known from DE 42 29 270 A1 and DE 10 2008 025 664 A1 that bondable coatings can be connected to a carrier strip through rolling. Thus, for example, EP 0 027 520 A1 and U.S. Pat. No. 4,521,257 A recommend the use of copper-tin alloys as carrier materials. The disadvantage of this material is that greater stability of the carrier material and lower costs are desired. More cost-efficient copper-zinc alloys have the disadvantage, however, that they can contaminate the aluminum-based bond layers and bond wires due to their high zinc content, and thus have a negative impact on the connection.

The trend toward increasingly more powerful, copper-based materials in power electronics, which specifically require good relaxation capability and a high degree of stability in addition to good electrical conductivity, is leading to a shift away from bronze materials and toward materials that are capable of excretion. Both with the more low-cost copper-zinc alloys and with other copper-based materials, it was determined that the bond wires can become loose from the bond surfaces, whereby the bond surfaces can break away.

An objective of the present invention is thus to overcome the disadvantages of the prior art. In particular, an objective is to find a method for producing a carrier strip and a carrier strip which meets the standards applicable to carrier strips for high power capacities without an unwanted defect occurring during production or with the electronic components produced using the method. Here, it is necessary, in particular, to avoid a contamination of the bond surface with harmful atoms and a tearing off or damage to the connection of the bond wire to the surface, or between the bond surface and the carrier strip. At the same time, it should be feasible to use the most cost-efficient materials possible as a carrier strip.

BRIEF SUMMARY OF THE PRESENT INVENTION

Objectives of the present invention are attained by means of a method for producing a bondable coating on a metallic carrier strip made of a made of a brass alloy with at least 15 wt. % zinc or a copper-based alloy containing at least 0.03 wt. % titanium, chromium, zirconium and/or cobalt, in a single working step, a bondable metallic functional layer. According to the method, in a single working step, a bondable metal functional layer made of aluminum or an aluminum-based alloy and a metallic intermediate layer are placed onto the metallic carrier strip and bonded thereto using a roll cladding method, wherein the intermediate layer is arranged hilly between the functional layer and the metallic carrier strip, so that no contact between the functional layer and the metallic carrier strip is created.

BRIEF DESCRIPTION OF THE SEVERAL VIEWS OF THE DRAWINGS

The foregoing summary, as well as the following detailed description of the present invention, will be better understood when read in conjunction with the appended drawings. For the purpose of illustrating the present invention, there are shown in the drawings embodiments which are presently preferred. It should be understood, however, that the present invention is not limited to the precise arrangements and instrumentalities shown.

In the drawings.

DETAILED DESCRIPTION OF THE PRESENT INVENTION

Figure 1:
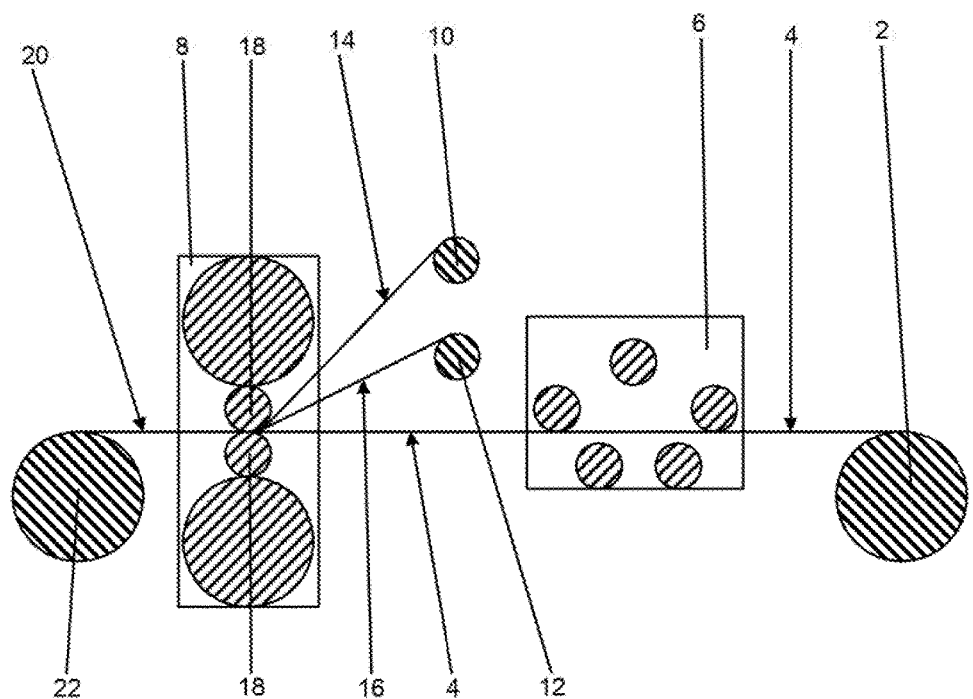
FIG. 1 shows a schematic profile view of a device for implementing a method according to an embodiment of the present invention.

The present invention is directed to a method for producing a bondable coating on a metallic carrier strip made of a made of a brass alloy with at least 15 wt. % zinc or a copper-based alloy containing at least 0.03 wt. % titanium, chromium, zirconium and/or cobalt, in a single working step. According to the method, in a single working step, a bondable metal functional layer made of aluminum or an aluminum-based alloy and a metallic intermediate layer are placed onto the metallic carrier strip and bonded thereto using a roll cladding method, wherein the intermediate layer is arranged fully between the functional layer and the metallic carrier strip, so that no contact between the functional layer and the metallic carrier strip is created.

In order to be bondable, the functional layer is designed in such a manner that it can be bonded with a bond wire, preferably with a bond wire made of aluminum or an aluminum-based alloy. Alternatively, bond wires made of gold or a gold alloy can also be bonded to the functional layer, or are bondable thereto.

Preferred alloys for the carrier strip according to the present invention are, for example, CuCrZr (UNS: C18400), CuZr0,1 (UNS: C15100), CuCrSiTi (UNS: C18070), CuCrAgFeTiSi (UNS: C18080), CuSnCrNiTi (UNS: C18090) and CuNi1Co1Si (UNS: C70350), which are particularly suitable as materials for a cost-efficient, mechanically robust carrier strip.

With such methods, it can be provided according to the present invention that an aluminum-silicon alloy is used as a metallic functional layer.

Such aluminum-silicon alloys can be particularly well and stably bonded to the standard aluminum-based bond wires.

With a further development of the method according to the present invention, it is also recommended that, preferably, copper or a copper-based alloy or nickel or a nickel-based alloy is used as a metallic intermediate layer.

Here, copper and copper-based alloys are preferred according to the present invention due to their lower cost compared to nickel and nickel-based alloys. The alloys or the metals are preferably free of zinc beyond impurifications. Such intermediate layers are suitable for capturing zinc atoms, i.e. they are suitable as a diffusion barrier layer. Furthermore, it is advantageous when the free surface of the carrier strip is covered over the area of the position of the functional layer, since in this area, when the coated carrier strip anneals, no zinc can evaporate and be deposited on the functional layer. A zinc deposit has a negative effect on the bondability of the functional layer. At the same time, a mechanically stable bond between the aluminum-based functional layer and a carrier layer made of a copper-based alloy containing at least 0.03 wt. % titanium, chromium, zirconium and/or cobalt can be created with such an intermediate layer.

According to the present invention, it can further be provided that the metallic functional layer and the metallic intermediate layer are placed as strips onto the metallic carrier strip, wherein the strip for the intermediate layer is arranged between the strip for the functional layer and the carrier strip and the strips laid one on top of the other are then bonded with each other using the roll cladding method.

With this method, industrial mass production can be realized in a particularly simple Manner. The coated carrier strip produced can then be cut into strips in the breadth and length desired for the application of the carrier structure.

With a method according to the present invention, with the use of strips as a starting product for the layers and for the carrier strip, it can in turn be provided that the metallic carrier strip, the metallic functional layer and the metallic intermediate layer are present prior to being joined together as rolled up endless strips. The strips are unrolled for bonding the layers in order to position the strips in relation to each other. The bonding of the strips is achieved by continuous roll cladding of the strips between rollers. Here, it can be provided that the strips are added via rolls.

According to the present invention, an endless strip is a strip with a length of at least 1 m, preferably a strip with a length of between 5 m and 100 m. The strip will naturally therefore not be endless in reality or literally. This method variant also serves to further simplify mass production.

With a further development of the method according to the present invention, it is also recommended that the carrier strip bonded with the intermediate layer and the functional layer is rolled up as an endless strip.

A rolled up coated carrier strip of this nature can then be further processed with production assemblies. The preliminary product produced with the endless strip thus serves to simplify subsequent equipment for mass production.

Furthermore, in order to secure a stable mechanical bond between the carrier strip and the intermediate layer, it can also be provided that the carrier strip is cleaned prior to bonding with the other strips, in particular cleaned mechanically with brushes and/or chemically. Preferably, the carrier strip is cleaned prior to the placing of the intermediate layer, wherein preferably, the strip for the intermediate layer and/or the strip for the functional layer is also cleaned prior to bonding, in particular cleaned mechanically with brushes and/or chemically.

As a result, it can be ensured that prior to bonding the intermediate layer and the functional layer with the carrier strip, no adhesive impurities have a negative impact on the mechanical stability of the coatings.

Instead of with brushes or in addition to cleaning with brushes, an air flow can also be blown onto the surface of the strips in order to remove residues such as chips which may have been created as a result of a peeling process.

It can also be provided according to the present invention that the carrier strip coated with the rolling cladding has a thickness of between 0.5 mm and 2 mm. The thickness of the intermediate layer following roll cladding is preferably between 5 μm and 30 μm. The thickness of the functional layer is preferably between 10 μm and 50 μm.

Furthermore, it can be provided that the carrier strip coated with the functional layer is used as a substrate for the electrical contacting of power components with bond wires, preferably for the purpose of producing low current contacts.

Some objectives that form the basis of the present invention are also attained by means of a coated carrier strip produced with such a method, in which the intermediate layer is arranged and affixed on the carrier strip and the functional layer is arranged and affixed on the intermediate layer.

As a result, it can be ensured that the intermediate layer is arranged fully between the functional layer and the metallic carrier strip as a stabilizing and chemically insulating bonding element (as a diffusion barrier). As a result, it is achieved that no contamination with zinc occurs anywhere on the functional layer or that the mechanical bond with the carrier strip is weakened due to the excretions of the above-named alloy elements present in the surface of the carrier strip in the form of oxides or compounds between the elements.

With such carrier strips, it can also be provided that the metallic carrier strip is a brass alloy with at least 15 wt. % zinc or a copper-based alloy with, at least 0.03 wt. % titanium, chromium, zirconium and/or cobalt.

With these alloys, the intermediate layer has a positive effect on the properties of the coated carrier strip, either as a diffusion barrier against zinc atoms or as a bridge of the excretions of the above-named alloy elements in the form of oxides or of compounds between the elements in the surface of the carrier strip, for the mechanical stabilization of the mechanical bond of the functional layer with the carrier layer.

Further, it can also be provided that the metallic functional layer is aluminum or an aluminum-based alloy, preferably an aluminum-silicon alloy.

Such aluminum-silicon alloys or pure aluminum can be particularly well and stably bonded with standard aluminum-based bond wires.

Additionally, it can be provided that the coated carrier strip is suitable as a substrate for the electrical contacting of power components with bond wires, preferably for the purpose of producing low current contacts.

Finally, it can also be provided according to the present invention that the metallic intermediate layer is copper or a copper-based alloy or, nickel or a nickel-based alloy.

The present invention is based on the surprising finding that through the insertion of an intermediate layer between the bondable functional layer and the carrier strip, it is possible to place on the intermediate layer as a supporting layer for affixing the functional layer, wherein the intermediate layer bridges weak points in the surface of the carrier strip, such as titanium oxide inclusions or other oxide inclusions, and thus provides a stable bond between the bondable functional layer and the carrier strip, and/or the intermediate layer as a diffusion barrier against an infusion of interfering atoms, in particular such as zinc atoms, from the carrier strip into the functional layer, in order to protect the functional layer against damaging effects from the atoms. As a result, the use of carrier strips made of materials which are lower cost and/or which are better suited due to their physical properties is possible without leading to a higher defect rate during production or a worsening of the bond between the bond wires and the functional surface and/or the substrate. Due to the fact that the layer bond is created in a single working step by means of roll cladding, the coated carrier strip can be produced at a low cost.

According to the present invention, it was determined that suitable copper materials for power electronics, which are typically alloyed with the elements Cr, Ti, Zr and Co (and/or other elements if appropriate), tend to form undissolved metal inclusions and/or metal oxide inclusions, depending on the alloy content. Examples of this for the material K75® (a copper-based alloy with 0.03 wt. % chromium, 0.1 wt. % titanium, 0.02 wt. % silicon and the rest copper) can be the occurrence of $TiO_2$ inclusions, which have a diameter and/or a longitudinal structure of e.g., 10 μm to 60 μm in profile. Cell-shaped, undissolved $TiO_2$ inclusions can be found in polished sections of materials, such as K75®. If these particles are located in the area close to the surface, they can reach the surface due to the stretching that occurs in a roll cladding process. Due to local non-adhesion, this entails an increased risk of adhesion failure or to a failure of a bond connection. Accordingly, from this finding according to the present invention, the need arises to find a solution approach to this problem.

Further, on the part of the user of such carrier strips, a reduction in the costs of roll cladded strips is required. One good option here is the more cost-efficient use of brass alloys containing a large quantity of zinc (Zn content at least 15%). Such copper-zinc alloys offer a significant cost saving of the carrier strip compared to CuSn6(copper-tin-bronze). Depending on the annealing treatment conducted, the high zinc content can, however, lead to an impact of the low-melting zinc on and a diffusion of the zinc into the bond substrate, thus leading to an impairment of the bond properties. Here, too, a new solution approach is provided by the present invention.

The method of inserting a diffusion barrier layer and/or a supporting layer as an intermediate layer can be used according to the present invention for a series of roll cladded material combinations. Here, a differentiation can be made between an entire surface intermediate layer and one that is selective. Entire surface intermediate layers serve primarily as diffusion barriers and adhesion agents, wherein selective intermediate layers have to date been specifically inserted for connector strips for reducing layer thickness using a pre-double. In both cases, nickel (Ni) or an Ni-based alloy is used.

The pre-double is a type of preliminary cladding of functional materials which contain precious metals in particular, which serves to enable the functional layer to be created and/or rolled on as thinly as possible following the actual cladding. The preliminary cladding is usually conducted in a separate step.

The method of inline direct cladding of intermediate layers as a diffusion compensation layer and/or adhesive agent layer specifically for the application field of selective roll cladding and bondable functional surfaces is here an entirely new approach. The intermediate layer is required in order to compensate and/or avoid the effects described above (contamination or impairment of the functional layer and oxide inclusions on the surface of the carrier strip), which have been detected within the scope of the present invention. The simultaneous cladding of the intermediate layer here enables a reduction of the additional process costs and thus enables the use of new carrier materials for bondable functional surfaces.

In order to avoid the effects described above (contamination/impairment and oxide inclusions) of the undissolved particles (oxide inclusions) close to the surface, or an impact on the bondable surfaces by zinc particles, according to the present invention, the necessary functional intermediate layer is cladded inline, i.e. during the actual cladding process, at the same time. Here, both a selective and full-surface (i.e. over the entire breadth of the carrier strip) intermediate layer is possible, wherein the selective variant is preferred. The breadth of the selective intermediate layer should be at least the same size as the breadth of the bondable functional surface, wherein a protrusion on both sides of the intermediate layer of at least 0.5 mm is preferred for adhesion purposes.

Possible materials for this intermediate layer are primarily copper (Cu) or copper-based alloys, as well as nickel (Ni) or nickel-based alloys. The inserted intermediate layer acts as an adhesive agent for the carrier substrates that cause excretion due to its higher (adhesive) strength and rigidity, and can better absorb local imperfections.

Accordingly, the inserted intermediate layer for brass carrier materials with a high zinc content demonstrates its effect as a diffusion compensation layer for the short-term annealing and/or diffusion process occurring during the production process (e.g., t=5 at 10 mins, with T=350 at 500° C.). The time- and temperature-dependent diffusion process of the zinc into the bondable functional surface, preferably an aluminum-silicon alloy (AlSi) is prevented or occurs predominantly in the intermediate layer.

The inline direct cladding of a specifically selective intermediate layer as a diffusion compensation layer and/or an adhesive agent layer for bondable surfaces offers to save complex process steps compared to the standard process with the use of a pre-double. The use of this intermediate layer furthermore enables the cost-efficient use of new carrier materials while at the same time guaranteeing a good adhesion of the bondable functional surface and/or functional layer.

The use of an inline-cladded selective intermediate layer as an adhesive agent can for example be implemented with the carrier material K75® as a carrier strip.

A coated carrier strip produced with a method according to the present invention can preferably be used in the area of press-fit connection technology and in new power electronics applications, in which more powerful copper- and excretion-based materials should be used. Such excretion-based materials are of increasing interest for use due to their specific relaxation capability and their high strength, while at the same time having good electrical conductivity. Furthermore, the use of a diffusion compensation layer is possible specifically for brass alloys with a high zinc content in the low-cost pressure sensor range.

FIG. 1 shows a schematic profile view of a device for implementing a method according to the present invention. On a winch 2 or a reel 2, there is a carrier strip 4 which consists of CuZn20 or another brass with at least 15 wt. % zinc or of an excretion-hardening copper-based alloy containing at least 0.03 wt. % titanium, chromium, zirconium and/or cobalt. For example, and particularly preferred, a Wieland-K75® copper-based alloy with 0.3 wt. % chromium, 0.1 wt, % titanium, 0.02 wt. % silicon and the remainder copper is used. Here, a potential material for the carrier strip 4 can in particular be the alloys CuCrZr (UNS: C18400), CuZr0,1 (UNS: C15100), CuCrSiTi (UNS:

C18070), CuCrAgFeTiSi (UNS: C18080), CuSnCrNiTi (UNS: C18090) and CuNi1Co1Si (UNS: C70350).

The rolled up carrier strip 4 is rolled out from the winch 2 and guided through a brushing machine 6 or another device for cleaning the surface of the carrier strip 4 which is to be coated. The cleaned carrier strip 4 is then transported to a roll cladding machine 8.

From a second winch 10 or a second reel 10, a strip 14 for a functional layer is rolled out and from a third winch 12 or a third reel 12 a strip 16 is rolled up for an intermediate layer. The strip 14 for the functional layer consists of an aluminum-silicon alloy, while the strip 16 for the intermediate layer consists of a nickel-based alloy or a copper-based alloy. The strips 14, 16 are also transported to the roll cladding machine 8. Here, the strip 16 for the intermediate layer is placed onto the carrier strip 4 and the strip 14 for the functional layer is placed onto the strip 16 for the intermediate layer. The strip 16 for the intermediate layer has at least the same breadth as the strip 14 for the functional layer, or is broader.

The strips 4, 14, 16 are then rolled on top of each other and cladded with the aid of two rollers 18 in the roll cladding machine 8 under pressure and, if desired, under an increased temperature, such as 200° C. to 600° C. According to the present invention, more than one strip 16 for the intermediate layer and more than one strip 14 for the functional layer can be transported in parallel and bonded with the carrier strip 4, so that the functional layers and intermediate layers produced are arranged adjacent to each other on the carrier strip 4. It is further possible to cover the carrier strip 4 fully with just one very broad strip 16 for the intermediate layer in order to produce an intermediate layer that largely or fully covers the carrier strip 4, and on the intermediate layer to produce several adjacent functional layers by placing on and roll cladding several adjacently positioned strips 14 for the functional layer.

The strips 4, 14, 16 are transported by the roll cladding machine 8 and bonded with each other there, and the coated carrier strip 20 which is created is rolled up again on a further winch 22 or reel 22. The use of such endless strips, which are not in reality endless, but can be between one meter and several hundred meters long, has the advantage that industrial mass production is easily possible.

Figure 2:
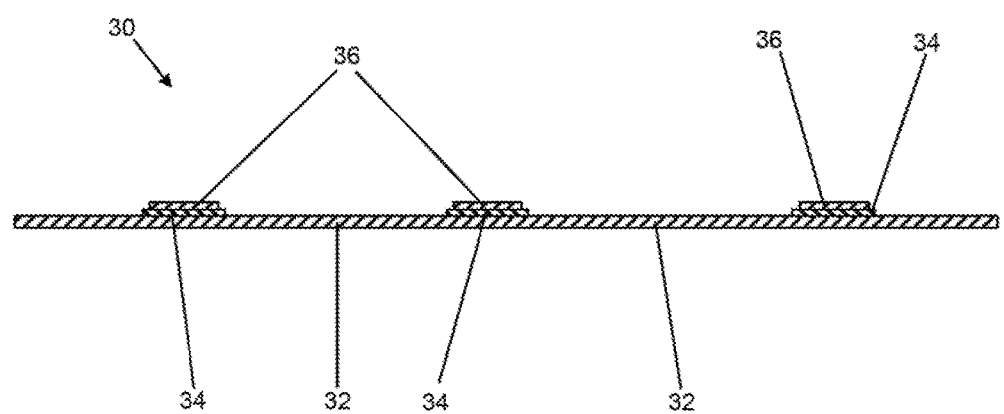
FIG. 2 shows a schematic profile view of a roll cladded coated carrier strip according to an embodiment of the present invention.

FIG. 2 shows a schematic profile view of a roll cladded coated carrier strip 30 according to the present invention, which can for example be produced using a method the same as that described in relation to FIG. 1.

On the carrier strip 32, three bands of an intermediate layer 34 made of a nickel-based alloy or a copper-based alloy have been placed using roll cladding. On these three bands of the intermediate layer 34, one functional layer 36 made of aluminum or an aluminum-silicon alloy is in turn affixed in each case using roll cladding.

The intermediate layer 34 has been bonded in a single working step with both the carrier strip 32 and the functional layer 36. The carrier strip 32 consists of an excretion-hardening copper-based alloy, such as CuCrZr (UNS: C18400), CuZr0,1 (UNS: C15100), CuCrSiTi (UNS: C18070), CuCrAgFeTiSi (UNS: C18080), CuSnCrNiTi (UNS: C18090) or CuNi1Co1Si (UNS: C70350), or a brass with a zinc portion of at least 15 wt. %. The intermediate layers 34 are broader than the functional layer 36 affixed to them respectively, for example at least 0.5 mm broader, wherein a protrusion on both sides of the intermediate layer is preferred. Any oxide inclusions contained in the carrier strip 32 such as titanium oxide, chrome oxide and/or zirconium oxide or metallic compounds such as compounds made of titanium, chromium and/or zirconium, which are located on the upper surface of the carrier strip 32 which faces in the direction of the bonding surface and which could impair bonding with a bonding wire (not shown) are covered by the intermediate layer 34. As a result, a secure bond between the bond wire and the functional layer 36 and thus with the carrier strip 32 can be achieved, even if local surface inclusions which interfere in the surface of the carrier strip 32 are present.

The thickness of the roll cladded intermediate layer 34 lies between 5 µm and 30 µm. The thickness of the functional layer 36 lies between 10 µm and 50 µm. The thickness of the entire carrier strip 32 with the intermediate layer 34 and the functional layer 36 lies between 0.5 mm and 2 mm.

When a brass alloy is used as a carrier strip 32, a contamination or impairment of the functional layer 36 with zinc can be prevented. The intermediate layer 34 then serves as a diffusion barrier layer which prevents an infusion of zinc atoms into the functional layer 36. This also has the effect that a secure bond between a bond wire and the bonding surface of the functional layer 36 can be produced.

Figure 3:
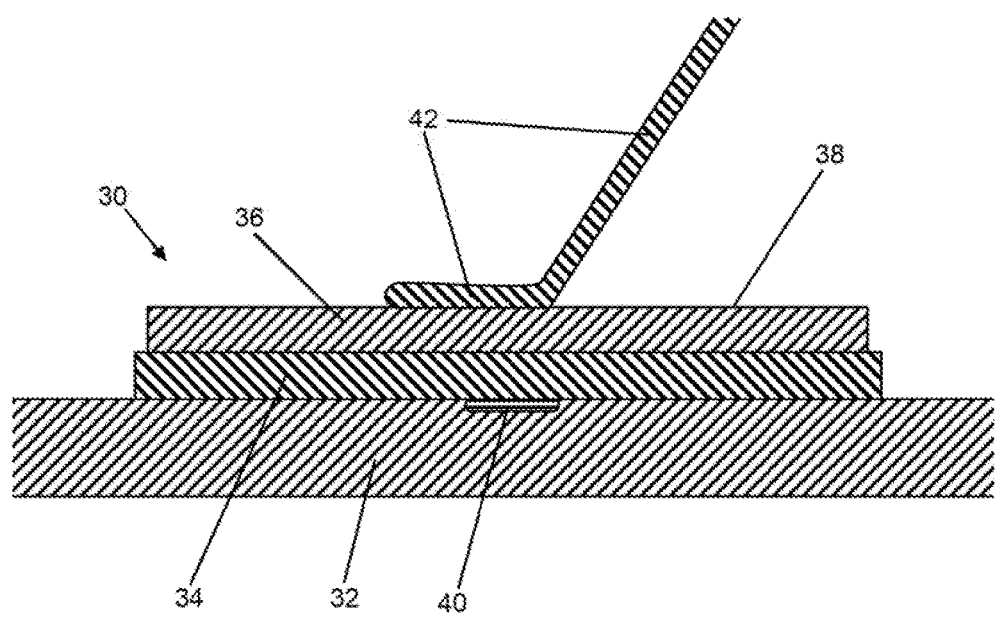
FIG. 3 shows an enlarged schematic profile view of the roll cladded coated carrier strip shown in FIG. 2 with a bonded bond wire.

FIG. 3 shows an enlarge schematic profile view of the roll cladded coated carrier strip 30 according to FIG. 2 with a bond wire 42 bonded to a bonding surface 38. In FIG. 3, for example, an oxide inclusion 40 (e.g., a titanium oxide inclusion) is shown in the surface of the carrier strip 32 which is covered by the intermediate layer 34. The bond wire 42 has been bonded with the bonding surface 38 of the functional layer 36 using a known method.

The features of the present invention disclosed in the above description and in the claims and exemplary embodiments can be essential both individually and in any combination required in order to realize the present invention in its different embodiments.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a bondable coating on a metallic carrier strip (4, 32) made of a brass alloy with at least 15 wt % zinc or a copper-based alloy containing at least 0.03 wt % titanium, chromium, zirconium and/or cobalt, the method comprising:

in a single working step, a bondable metallic functional layer (14, 36) made of aluminum or an aluminum-based alloy and a metallic intermediate layer (16, 34) being placed onto the metallic carrier strip (4, 32) and bonded thereto using a roll cladding method, wherein the intermediate layer (16, 34) is arranged fully between the bondable metallic functional layer (14, 36) and the metallic carrier strip (4, 32), so that no contact between the bondable metallic functional layer (14, 36) and the metallic carrier strip (4, 32) is created, and wherein the bondable metallic functional layer (14, 36) and the metallic intermediate layer (16, 34) are placed as strips (14, 16) onto the metallic carrier strip (4, 32), the strip (16) of the metallic intermediate layer (16, 34) being arranged between the strip (14) of the bondable metallic functional layer (14, 36) and the metallic carrier strip (4, 32), and wherein the strips (14, 16) of the metallic intermediate layer and the bondable metallic functional layer which are arranged one on top of the other are then bonded with each other using the roll cladding method.

2. The method according to claim 1, wherein an aluminum-silicon alloy is used as the bondable metallic functional layer (14, 36).

3. The method according to claim 1, wherein copper or a copper-based alloy or nickel or a nickel-based alloy is used as the metallic intermediate layer (16, 34).

4. The method according to claim 1, wherein the metallic carrier strip (4, 32), the bondable metallic functional layer (14, 36) and the metallic intermediate layer (16, 34) are present, prior to being joined together, as rolled up strips (4, 10, 12) having a length of at least 1 m, which are unrolled for bonding the layers in order to position the strips (4, 14, 16) in relation to each other, wherein the bonding of the strips (4, 14, 16) is achieved by continuous roll cladding of the strips (4, 14, 16) between rollers (18).

5. The method according to claim 1, wherein the metallic carrier strip (4, 32) bonded with the metallic intermediate layer (16, 34) and the bondable metallic functional layer (14, 36) is rolled up as a strip (20) having a length of at least 1 m.

6. The method according to claim 1, wherein the carrier strip (4, 32) is cleaned prior to bonding with the other strips (14, 16, 34, 36).

7. The method according to claim 1, wherein the carrier strip (4, 32) coated with the bondable metallic functional layer (14, 36) is used as a substrate for the electrical contacting of power components with bond wires (42).

8. The method according to claim 6, wherein the carrier strip (4, 32) is cleaned mechanically with brushes and/or chemically.

9. The method according to claim 6, wherein the carrier strip (4, 32) is cleaned prior to the placing of the intermediate layer (16, 34).

10. The method according to claim 6, wherein the strip (16) for the intermediate layer (16, 34) or the strip (14) for the functional layer (14, 36) is also cleaned prior to bonding or the strip (16) for the intermediate layer (16, 34) and the strip (14) for the functional layer (14, 36) are also cleaned prior to bonding.

11. The method according to claim 6,
wherein the strip (16) for the intermediate layer (16, 34) or the strip (14) for the functional layer (14, 36) is cleaned mechanically with brushes and/or chemically, or
wherein the strip (16) for the intermediate layer (16, 34) and the strip (14) for the functional layer (14, 36) are cleaned mechanically with brushes and/or chemically.

12. The method according to claim 1, wherein the carrier strip (4, 32) coated with the functional layer (14, 36) is used as a substrate for electrical contacting of power components with bond wires (42) for the purpose of producing low current contacts.

13. The method according to claim 6, wherein the carrier strip (4, 32) is cleaned mechanically with brushes or chemically or mechanically with brushes and chemically, prior to the placing of the intermediate layer (16, 34), wherein the strip (16) for the metallic intermediate layer (16, 34) and/or the strip (14) for the bondable metallic functional layer (14, 36) is also cleaned prior to bonding.

* * * * *